(12) United States Patent
Wu

(10) Patent No.: US 10,177,786 B2
(45) Date of Patent: Jan. 8, 2019

(54) ADAPTIVE DESATURATION IN MIN-SUM DECODING OF LDPD CODES

(71) Applicant: Tidal Systems, Inc., Santa Clara, CA (US)

(72) Inventor: Yingquan Wu, Palo Alto, CA (US)

(73) Assignee: Tidal Systems, Inc., Santa Clara, CA (US)

( * ) Notice: Subject to any disclaimer, the term of this patent is extended or adjusted under 35 U.S.C. 154(b) by 0 days.

(21) Appl. No.: 15/665,501

(22) Filed: Aug. 1, 2017

(65) Prior Publication Data

US 2017/0331495 A1    Nov. 16, 2017

Related U.S. Application Data

(63) Continuation of application No. 14/808,793, filed on Jul. 24, 2015, now Pat. No. 9,755,666.

(51) Int. Cl.
*H03M 13/11* (2006.01)
*H03M 13/00* (2006.01)

(52) U.S. Cl.
CPC ........ *H03M 13/112* (2013.01); *H03M 13/114* (2013.01); *H03M 13/116* (2013.01); *H03M 13/1137* (2013.01); *H03M 13/658* (2013.01)

(58) Field of Classification Search
CPC ............. H03M 13/112; H03M 13/116; H03M 13/616; H03M 13/114; H03M 13/658; H03M 13/6591; H03M 13/1137
See application file for complete search history.

(56) References Cited

U.S. PATENT DOCUMENTS 8,281,210 B1    10/2012  Farjadrad et al.
9,048,870 B2    6/2015   Li et al.

OTHER PUBLICATIONS

Kim et al., A high speed layered min-sum LDPC decoder for error correction of NAND flash memories, 2011, IEEE, pp. 1 to 4.*
Li et al., A low complexity LDPC decoder for NAND flash applications, 2014, IEEE, pp. 213-216.*
Emran et al., Optimized quantization and scaling of layered LDPC scaled min sum decoder, Jun. 2015, IEEE, pp. 2668-2672.*
Chen, et al. "Reduced-Complexity Decoding of LDPC Codes" IEEE Transactions on Communications, vol. 53, Issue 8, Aug. 2005, pp. 1288-1299.
Mansour, et al. "High-Throughput LDPC Decoders" IEEE Transactions on VLSI Systems, vol. 11, Issue 6, Dec. 2003, pp. 976-996.
Hocevar "A Reduced Complexity Decoder Architecture via Layered Decoding of LDPC Codes" IEEE Workshop on Signal Processing Systems Design and Implementation (SIPS), Oct. 2004, pp. 107-112.

(Continued)

*Primary Examiner* — Shelly A Chase
(74) *Attorney, Agent, or Firm* — Brooks, Cameron & Huebsch, PLLC

(57) ABSTRACT

A system implements adaptive desaturation for the min-sum decoding of LDPC codes. Specifically, when an-above threshold proportion of messages from check nodes to variable nodes (CN-to-VN messages) are saturated to a maximum fixed-precision value, all CN-to-VN messages are halved. This facilitates the saturation of correct messages and boosts error correction over small trapping sets. The adaptive desaturation approach reduces the error floor by orders of magnitudes with negligible add-on circuits.

19 Claims, 4 Drawing Sheets

(56) References Cited

OTHER PUBLICATIONS

Kim, et al. "A Reduced-Complexity Architecture for LDPC Layered Decoding Schemes" IEEE Transactions on VLSI Systems, vol. 19, Issue 6, Jun. 2011, pp. 1099-1103.
Zhang, et al. "Quantized Iterative Message Passing Decoders with Low Error Floor for LDPC Codes" IEEE Transactions on Communications, vol. 62, Issue 1, Jan. 2014, pp. 1-14.
Zhang, et al. "Shuffled Iterative Decoding" IEEE Transactions on Communications, vol. 53, Issue 2, Feb. 2005, pp. 209-213.

\* cited by examiner

ADAPTIVE DESATURATION IN MIN-SUM DECODING OF LDPD CODES

PRIORITY INFORMATION

This application is a Continuation of U.S. application Ser. No. 14/808,793 filed Jul. 24, 2015, the specification of which is incorporated herein by reference.

BACKGROUND

Filed of the Invention

This invention relates to systems and methods for implementing a low density parity check (LDPC) decoding algorithm.

Background of the Invention

A. LDPC Codes and Min-Sum Decoding

Low-density parity-check (LDPC) codes were discovered by Gallager in 1962, and rediscovered and shown to be Shannon-limit approaching in the late 1990's. Its very low density of 1's in H matrix renders it convenient to represent an LDPC code by a bipartite graph, called a Tanner Graph. There are two types of nodes in a Tanner graph, namely, variable nodes (VN's) and check nodes (CN's). Each variable node (or check node) corresponds to a column (or row) of the parity-check matrix H. We denote by $V=\{v_1, v_2, \ldots v_n\}$ the set of variable nodes, and by $C=\{c_1, c_2, \ldots c_m\}$ the set of check nodes. We also index each row of H by $c = \{1, 2, \ldots, m\}$ and each column of H by $v = \{1, 2, \ldots, n\}$. In the Tanner graph, VN $v_i$ is connected to CN $c_j$ via an edge if $H_{j,i}=1$, and the set of edges on the Tanner graph is denoted by set E (see FIGS. 4A and 4B).

Quasi-cyclic (QC) LDPC codes are a special class of the LDPC codes with structured H matrix which can be generated by the expansion of an $m_b \times n_b$ base matrix. Each 1's element in the base matrix can be expanded by a circularly right-shifted b×b identity sub-matrix. QC-LDPC codes have advantages over other types of LDPC codes in hardware implementations of both encoding and decoding. Encoding of a QC-LDPC code can be efficiently implemented using simple shift registers. In hardware implementation of a QC-LDPC decoder, the QC structure of the code simplifies the wire routing for message passing.

The message-passing (MP) algorithm is the most efficient to achieve near-optimal decoding of LDPC codes. We now briefly introduce the variable node (VN) and check node (CN) update rules of message passing decoding. In the sequel, for notational conciseness, we simply use i, instead of $v_i$, to denote a VN, and, j, instead of $c_j$, to denote a CN. A VN i receives an input message $L_i^{ch}$ from the channel, typically the log-likelihood ratio (LLR) of the corresponding channel output, defined as follows:

$$L_i^{ch} = \log\left(\frac{Pr(R_i = r_i \mid c_i = 0)}{Pr(R_i = r_i \mid c_i = 1)}\right) = \log \quad (1)$$

where $c_i \in \{0,1\}$ is the code bit and $r_i$ is the corresponding received symbol.

The conventional iterative MP decoder alternates between two phases, a "VN-to-CN" phase during which VN's send messages to CN's along their adjacent edges, and a "CN-to-VN" phase during which CN's send messages to their adjacent VN's. The message update rules, whose details will be given later in this section, are depicted schematically in Tables. 1 and 2, respectively. In the initialization step of the decoding process, VN i forwards the same message to all of its neighboring CN's, $v$ (i), namely the LLR $L_i^{ch}$ derived from the corresponding channel output. In the CN-to-VN message update phase, CN j uses the incoming messages and CN update rule to compute and forward, to VN i∈$c$ (j) a new "CN-to-VN" message, Lj→i. VN i then processes its incoming messages according to VN update rule and forwards to each adjacent CN, $c$ (i), an updated "VN-to-CN" message, Li→j. After a pre-specified number of iterations, VN i sums all of the incoming LLR messages to produce an estimate of the corresponding code bit i. Note that all of the "CN-to-VN" message updates can be done in parallel, as can all of the "VN-to-CN" message updates. This enables efficient, high-speed software and hardware implementations of the iterative MP decoding algorithms.

Denote by Li→j and Lj→i the messages sent from VN i to CN j and from CN j to VN i, respectively. Denote by $c$ (i) the set of CN's directly connected to VN i and V(j), the set of VN's directly connected to CN j. Then, the message sent from VN i to CN j in SPA (sum-product algorithm) decoding is given by:

$$L_{i \to j} = L_i^{ch} + \Sigma_{j' \in C(i) \setminus j} L_{j' \to i}, \quad (2)$$

and the message from CN j to VN i is computed as $$L_{j \to i} = 2\tanh^{-1}\left(\prod_{i' \in v(j) \setminus i} \tanh\frac{L_{i' \to j}}{2}\right). \quad (3)$$

Denote by $P_i$ a posterior probability (APP) message of VN $$P_i = L_i^{ch} + \Sigma_{j' \in C(i)} L_{j' \to i} \quad (4)$$

In practically prevailing min-sum decoding, a VN takes log-likelihood ratios of received information from the channel as initial input message, i.e., $L_{i \to j} = L_i^{ch}$, and the following equivalent CN update rule is employed $$L_{j \to i} = \left[\prod_{i' \in v(j) \setminus i} \text{sign}(L_{i' \to j})\right] \cdot \alpha \cdot (\beta + \min_{i' \in v(j) \setminus i} |L_{i' \to j}|), \quad (5)$$

where 0<α, β<1 are the attenuation factor and offset, respectively, which can be a fixed constant or adaptively adjusted [1]. We next introduce some notations to simplify the above calculation in the algorithmic procedure. Let $$S_{i \to j} \triangleq \text{sign}(L_{i \to j}). \quad (6)$$

Denote by $S^{(j)}$ the product sign of all VN i's to the CN j $$S^{(j)} \triangleq \Pi_{i' \in v(j)} S_{i' \to j} \quad (7)$$

Denote by $L_{min1}^{(j)}$ and $i_{min1}^{(j)}$ the normalized minimum VN message to the CN j and its associated index, respectively, $$L_{min1}^{(j)} \triangleq \alpha \cdot (\beta + \min_{i' \in v(j)} |L_{i' \to j}|), \quad i_{min1}^{(j)} \triangleq \arg\min_{i' \in v(j)} |L_{i' \to j}| \quad (8)$$

and by $L_{min2}^{(j)}$ the normalized second minimum VN message to the CN j $$L_{min2}^{(j)} \triangleq \alpha \cdot (\beta + \min_{i' \in v(j) \setminus i_{min1}^{(j)}} |L_{i' \to j}|) \quad (9)$$

With the above notations, (5) is conveniently re-expressed by $$L_{j \to i} = S^{(j)} \cdot S_{i \to j} \cdot \begin{cases} L_{min1}^{(j)} & \text{if } i \neq i_{min1}^{(j)} \\ L_{min2}^{(j)} & \text{if } i = i_{min1}^{(j)} \end{cases} \quad (10)$$

A hardware amenable min-sum decoding algorithm is described in Algorithm 1 of Table 1.

TABLE 1

Flooding Min-Sum Decoding
Algorithm 1 Flooding Min-Sum Decoding,

Initialization: $L_{min1}^{(j)} = L_{min2}^{(j)} = 0, \forall j \in \mathcal{C}$
Iteration:
1: for $\forall i \in \mathcal{V}$, do
2:   for $\forall j \in \mathcal{C}(i)$, do
3:     Read (old) $\{S^{(j)}, i_{min1}^{(j)}, L_{min1}^{(j)}, L_{min2}^{(j)}\}$
4:     Compute $L_{j \to i} \leftarrow \begin{cases} S^{(j)} \cdot S_{i \to j} \cdot L_{min1}^{(j)}, & \text{if } i \neq i_{min1}^{(j)} \\ S^{(j)} \cdot S_{i \to j} \cdot L_{min2}^{(j)}, & \text{if } i = i_{min1}^{(j)} \end{cases}$
5:   end for
6:   Compute: $P_i \leftarrow L_i^{ch} + \Sigma_{j \in \mathcal{C}(i)} L_{j \to i}$
7:   for $\forall j \in \mathcal{C}(i)$, do
8:     Compute $L_{i \to j} \leftarrow P_i - L_{j \to i}$
9:     Store $S_{i \to j} \leftarrow \text{sign}(L_{i \to j})$
10:    Update CN j's new information, $\{S^{(j)}, i_{min1}^{(j)}, L_{min1}^{(j)}, L_{min2}^{(j)}\}$, with respect to $L_{i \to j}$.
11:   end for
12: end for
13: Store all $\{S, i_{min1}, L_{min1}, L_{min2}\}$
14: If the hard-decision of $[P_1, P_2, \ldots, P_n]$ yields the all-zero syndrome, then terminate When a QC-LDPC code with b×b circulants is in use, each circulant of b bits are updated independently and in parallel. A new non-uniform quantization method was proposed to extend the message quantization range by using exponentially increased step size for large magnitudes while keeping fixed step size for small magnitudes. However, the proposed exponentially increased step size design is difficult for hardware implementation.

B. Layered Min-Sum Decoding

In the hardware implementation of iterative MP decoding, the decoding efficiency can be further improved by the layered decoding approach [2]-[4]. The layered decoding is based on a serial update of CN messages. Instead of sending all messages from VN's to CN's, and then all messages from CN's to VN's, the layered coding go over the CN's in sequential order such that, to each updating CN, all messages are sent in and processed, and then sent out to neighboring VN's. Such scheduled serial updates on CN's enables immediate propagation of the newly updated message; unlike the conventional flooding scheme where the updated messages can propagate only in next iteration.

The layered decoding roughly increases convergence speed by twice over the conventional flooding implementation. Moreover, it provides a good trade-off between speed and memory. This is achieved by iterating over dynamic CN-to-VN messages, denoted by $Q \triangleq \{Q_1, Q_2, \ldots, Q_n\}$. Specifically, let VN $i \in \mathcal{V}(j)$, then $Q_i$ over a layer j is defined as $$Q_i^{(j)} \triangleq L_{j \to i} = L_i^{ch} + \Sigma_{j' \in \mathcal{C}(i) \setminus j} L_{j' \to i}^{(last)}, \quad (11)$$

where the superscript $^{(last)}$ denotes the latest updated. It is worth noting that, in layered decoding the VN-to-CN message updated at the last layer (all but the last are from the current iteration) is utilized to update the CN-to-VN $Q_i$ in the current layer, whereas in the conventional flooding decoding updating a CN-to-VN message $L_{1 \to i}$ utilizes the VN-to-CN messages each generated at the last iteration. $Q \triangleq \{Q_1, Q_2, \ldots Q_n\}$ memory is initialized with the channel messages $L^{ch} \triangleq [L_1^{ch}, L_2^{ch}, \ldots, L_n^{ch}]$, and no dedicated memory is needed to store $L^{ch}$, whereas in flooding method, $L^{ch}$ is stored but not $Q \cdot Q_i$, i=1, 2, . . . , n, is iteratively calculated as follows. Let j be the current layer and $j_i$ be the preceding layer associated with VN i (herein a preceding layer is mathematically declared as follows. Let $j_1 < j_2 < \ldots < j_k$ be all CN's directly connected of VN i, then $j_l$ is the preceding layer of $j_{l+1}$ for l=1, 2, . . . , k−1, and $j_k$ is the preceding layer of $j_1$.).

The APP (a-posterior probability) message $P_i$ at the layer j is calculated as $$P_i^{(j)} = Q_i^{(j)} + L_{j_i \to i}^{new} \quad (12)$$

where $L_{j_i \to i}^{new}$ is newly updated and $Q_i$ is iteratively updated by $$Q_i^{(j)} = P_i^{(j)} - L_{j \to i}^{old}, \quad (13)$$

where $L_{j \to i}^{old}$ was updated exactly one iteration back. The layered decoding can be applied to all types of iterative MP (message passing) decoding, including SAP and min-sum decoding. A hardware amenable layered min-sum decoding algorithm is described in Table 2.

TABLE 2

Layered Min-Sum Decoding.
Algorithm 2 Layered Min-Sum Decoding

Initialization: $L_{min1}^{(j)} = L_{min2}^{(j)} = 0, \forall j \in \mathcal{C}; Q_i = L_i^{ch}, \forall i \in \mathcal{V}; \mathcal{L} = 0$
Iteration:
1: for $\forall j \in \mathcal{L}$ do
2:   for $\forall i \in \mathcal{V}(j)$ do
3:     Read new $\{S^{(j_i)}, i_{min1}^{(j_i)}, L_{min1}^{(j_i)}, L_{min2}^{(j_i)}\}$, where $j_i$ is the preceding layer of VN i
4:     Compute $L_{j_i \to i}^{new} \leftarrow \begin{cases} S^{(j_i)} \cdot S_{i \to j_i} \cdot L_{min1}^{(j_i)}, & \text{if } i \neq i_{min1}^{(j_i)} \\ S^{(j_i)} \cdot S_{i \to j_i} \cdot L_{min2}^{(j_i)}, & \text{if } i = i_{min1}^{(j_i)} \end{cases}$
5:     Compute $P_i \leftarrow Q_i + L_{j_i \to i}^{new}$
6:     Read (old) $\{S^{(j)}, i_{min1}^{(j)}, L_{min1}^{(j)}, L_{min2}^{(j)}\}$.
7:     Compute $L_{j \to i}^{old} \leftarrow \begin{cases} S^{(j)} \cdot S_{i \to j} \cdot L_{min1}^{(j)}, & \text{if } i \neq i_{min1}^{(j)} \\ S^{(j)} \cdot S_{i \to j} \cdot L_{min2}^{(j)}, & \text{if } i = i_{min1}^{(j)} \end{cases}$
8:     Compute $Q_i \leftarrow P_i - L_{j \to i}^{old}$.
9:     Store $S_{i \to j} = \text{sign}(Q_i)$
10:    Update CN j's new information, $\{S^{(j)}, i_{min1}^{(j)}, L_{min1}^{(j)}, L_{min2}^{(j)}\}$, with respect to $Q_i$.
11:   end for
12:   Store $\{S^{(j)}, i_{min1}^{(j)}, L_{min1}^{(j)}, L_{min2}^{(j)}\}$
13: end for
14: If the hard-decision of $[P_1, P_2, \ldots, P_n]$ yields the all-zero syndrome, then stop.
15: Circularly increase layer number $\mathcal{L}$ by 1.

When a QC-LDPC code with b×b circulants is in use, b QC rows of H is naturally treated as a layer, that is, a layer contains b CN's, each being updated independently and in parallel.

The systems and methods disclosed herein provide an improved approach for performing LDPC decoding using Tanner graphs.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
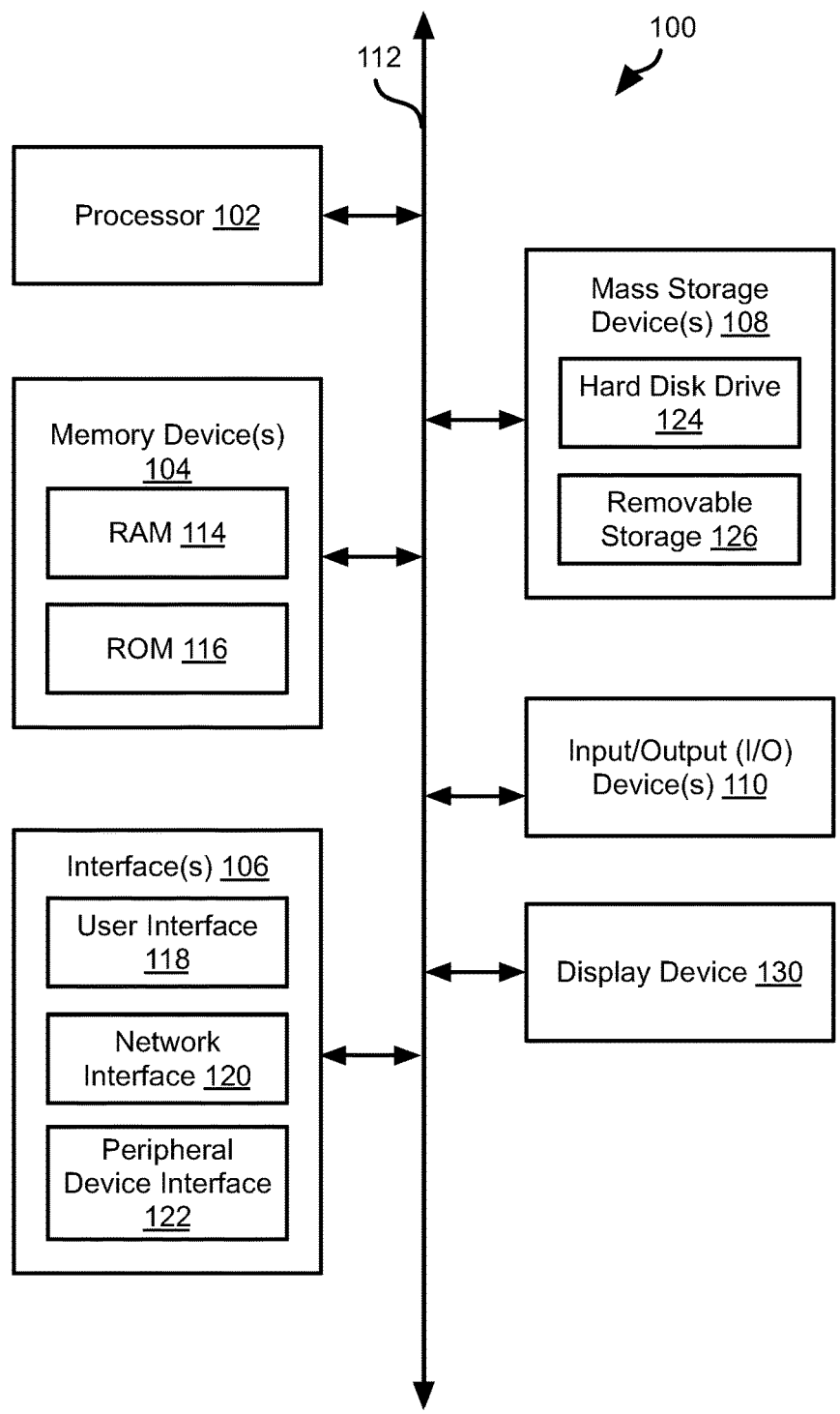
FIG. 1 is a schematic block diagram of a computer system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods performing LDPC decoding. A method is disclosed for performing LDPC decoding, specifically layered min-sum decoding using a Tanner graph including check nodes (CN) and variable nodes (VN). Messages passed between nodes are quantized in a non-uniform manner. Values below a threshold are uniformly quantized whereas values above the threshold are non-uniformly quantized. A corresponding inverse-quantization is also defined.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various functions as discussed herein. Computing device 100 can be any of a wide variety of computing devices, such as a desktop computer, a notebook computer, a server computer, a handheld computer, tablet computer and the like. In some embodiments, a hardware device containing circuits implementing the methods disclosed herein may be included in the computing device 100 or embedded in any of the components of the computing device listed below.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
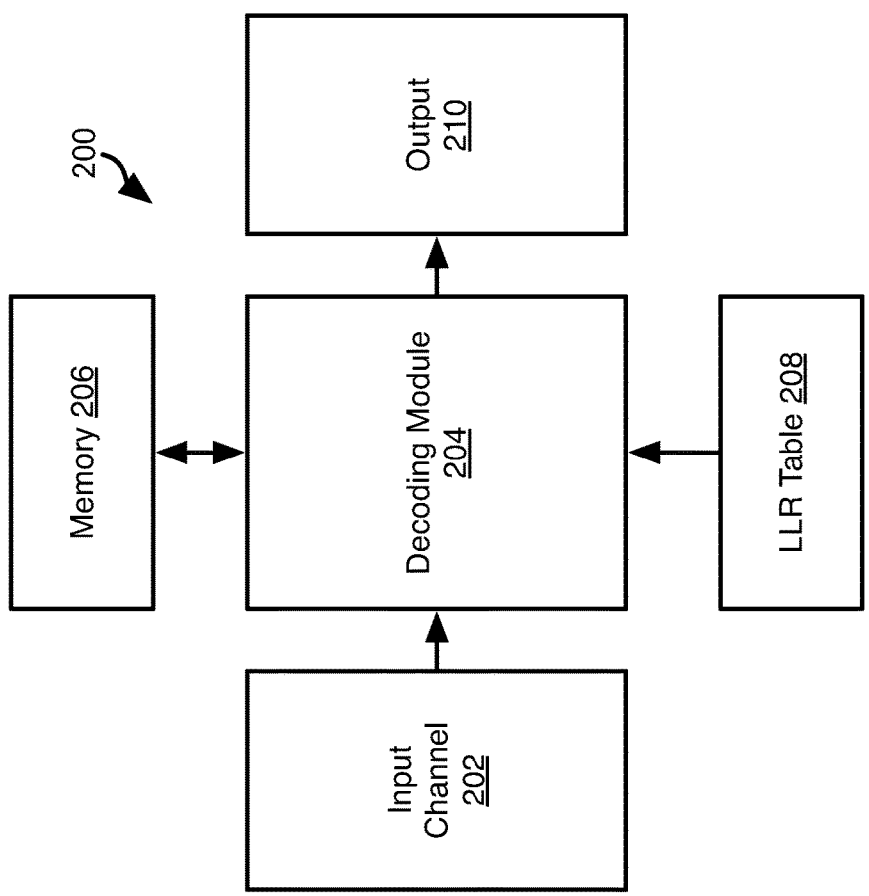
FIG. 2 is a schematic block diagram of components for implementing methods in accordance with embodiments of the invention.

Referring to FIG. 2, the illustrated system 200 may be used to perform the methods disclosed herein. The illustrated components may be specific electronic components or software modules executed by a computing device 100. The system 200 may include an input channel 202 from which data is received. The input channel 202 may be any device or interface. The data from the input channel 202 may be received by a decoding module 204 implementing the methods disclosed herein. As noted above, the decoding module 204 may be implemented by software or hard-coded circuits or a digital processor.

The data received from the input channel 202 may be data encoded according to an LDPC encoding algorithm. The decoding module 204 is programmed or configured with circuits implementing the methods disclosed herein in order to perform the decoding. To facilitate decoding, a memory 206 for storing intermediate results and an LLR table 208 may be coupled to the decoding module 204. The decoding module 204 generates an output 210 that is the data extracted from encoded data received from the input channel 202.

Figure 3:
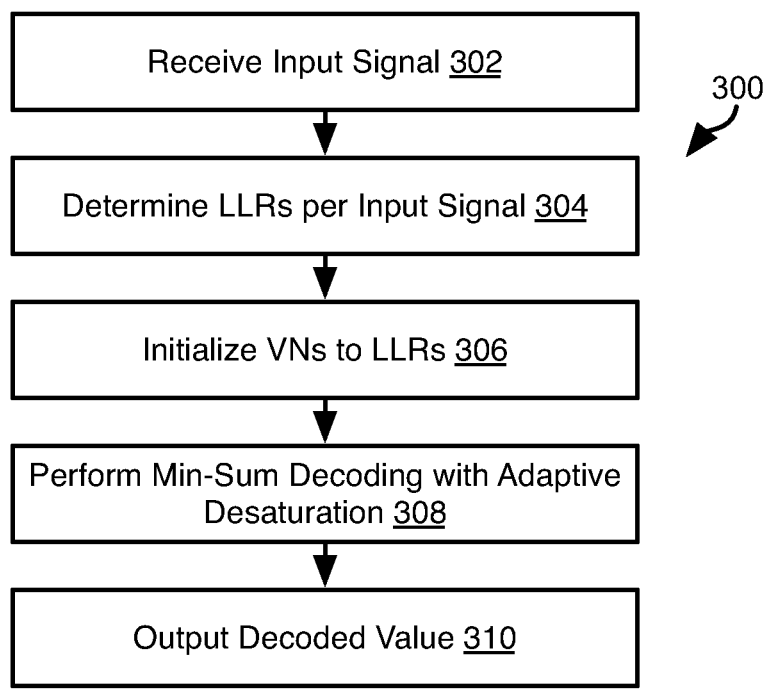
FIG. 3 is a process flow diagram of a method in accordance with an embodiment of the present invention.
Figure 4A:
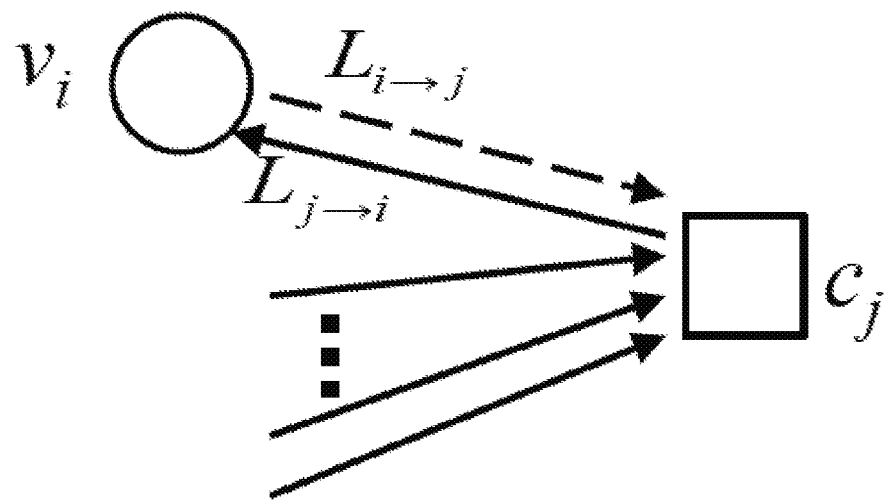
FIGS. 4A and 4B illustrate the passing of messages between check nodes (CN) and variable nodes (VN) in accordance with min-sum decoding.
Figure 4B:
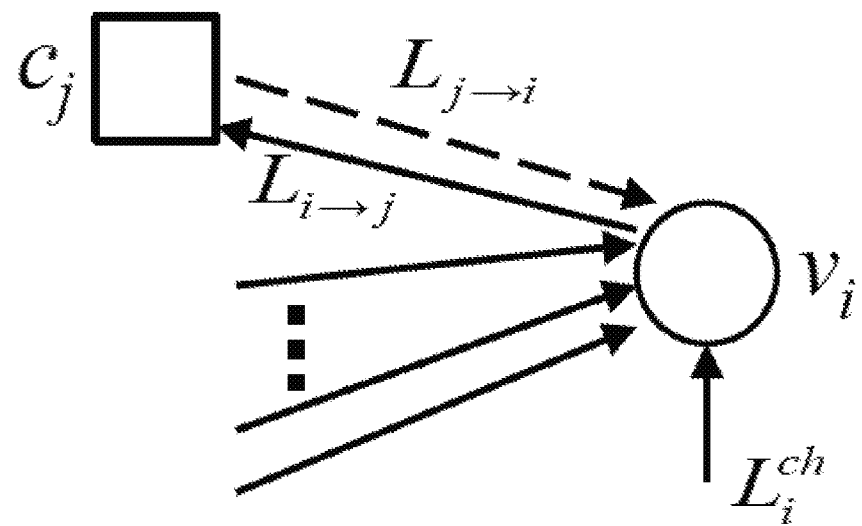

Referring to FIG. 3, the system 200, or some other device, such as a general purpose computer, may perform the illustrated method 300. The method 300 may include receiving 302 an input signal and determining 304 one or more log likelihood ratios (LLR) as defined above for one or more symbols in the input signal. The VNs of a Tanner graph as defined above may then be initialized 306 to the LLRs as described above or according to any of the methods described below. The method 300 may further include performing 308 min-sum decoding with adaptive desaturation to obtain a decoded value and outputting 310 the decoded value. Performing 308 min-sum decoding may include performing Algorithm 3 of Table 3 or Algorithm 4 of Table 4.

In intensive simulations conducted by the inventor of (layered) min-sum decoding on various LDPC codes, it was observed that the range of messages passed between VN's and CN's in the decoder has direct impact on the decoding performance in terms of both convergence speed and error-rate. It has been observed that, when fixed-point magnitude is not enforced, correct messages typically grow faster than incorrect messages, most errors due to small trapping sets are correctable. However, given limited precision in practice, after certain number of iterations, messages tend to saturate to the maximum fixed-point magnitude. In such scenarios, correct messages are not able to outweigh incorrect messages, and the message passing is gradually downgraded to bipolar messages.

These observations serve as the motivation for new adaptive quantization methods. One approach to expand the range of represented values by message index is to scale down the messages after certain criterion is met. For example, not limited to, if at the end of an iteration the number of saturated CN's, denoted by $\Theta_C$, is greater than a pre-defined threshold, denoted by $\Theta$, then all the messages in the decoder will be scaled down by half at the next iteration. Herein a CN j is declared "saturated" if $L_{min1}^{(j)}$ reaches the maximum finite-precision magnitude. This enables to effectively increase the quantization range without increasing complexity or memory.

Algorithm 3 of Table 3 incorporates modifications into the conventional flooding decoding to enable the above exemplary desaturation. Algorithm 4 of Table 4 incorporates modifications into the conventional layered decoding to enable the above exemplary desaturation.

At each end of an iteration, the number of saturated CN's is compared against a pre-defined threshold. If greater than the pre-defined threshold, then the desaturation signal, $I_{des}$, is set on for the next iteration. For flooding decoding, desaturation is simply achieved by halving each CN-to-VN message, $L_{j \to i}$. For layered decoding, desaturation comprises two parts, one is to halve all APP messages at the first time (but not for the revisited) of the current iteration; the other is to halve all old VN-to-CN messages (generated during the preceding iteration). We observe that the two parts together equally halves the revisited Q and P messages during the iteration. Note that having a desaturation check at the end of iteration may introduce extra latency. To eliminate this latency, one may alternatively consider performing the desaturation check using partial CN's, e.g., up to the second to last layer. Based on the extensive simulations, desaturation decision based upon all but the last layer of CN's results in negligible performance degradation. With the above design, we observe that the LDPC error floor can be substantially reduced.

TABLE 3

Desaturated Flooding Min-Sum Decoding
Algorithm 3 Desaturated Flooding Min-Sum Decoding Initialization: $L_{min1}^{(j)} = L_{min2}^{(j)} = 0, \forall j \in \mathcal{C}; I_{des}$ = off
Iteration:
1: for $\forall i \in \mathcal{V}$, do
2:   for $\forall j \in \mathcal{C}(i)$, do
3:     Read (old) $\{S^{(j)}, i_{min1}^{(j)}, L_{min1}^{(j)}, L_{min2}^{(j)}\}$
4:
$$\text{Compute } L_{j \to i} \leftarrow \begin{cases} S^{(j)} \cdot S_{i \to j} \cdot L_{min1}^{(j)}, & \text{if } i \neq i_{min1}^{(j)} \\ S^{(j)} \cdot S_{i \to j} \cdot L_{min2}^{(j)}, & \text{if } i = i_{min1}^{(j)} \end{cases}$$
5:     If $I_{des}$ = on, then set $L_{j \to i} \leftarrow L_{j \to i}/2$.
6:   end for
7:   Compute: $P_i \leftarrow L_i^{ch} + \sum_{j \in \mathcal{C}(i)} L_{j \to i}$
8:   for $\forall j \in \mathcal{C}(i)$, do
9:     Compute $L_{i \to j} \leftarrow P_i - L_{j \to i}$
10:     Store $S_{i \to j} \leftarrow \text{sign}(L_{i \to j})$
11:     Update CN j's new information, $\{S^{(j)}, i_{min1}^{(j)}, L_{min1}^{(j)}, L_{min2}^{(j)}\}$, with
    respect to $L_{i \to j}$.
12:   end for
13: end for
14: Store all $\{S, i_{min1}, L_{min1}, L_{min2}\}$.
15: If the number of saturated $L_{min1}$ is greater than $\Theta$, then set $I_{des}$ = on, otherwise off.
16: If the hard-decision of $[P_1, P_2, \ldots, P_n]$ yields the all-zero syndrome, then stop.

TABLE 4

Desaturated Layered Min-Sum Decoding
Algorithm 4 Desaturated Layered Min-Sum Decoding Initialization: $L_{min1}^{(j)} = L_{min2}^{(j)} = 0, \forall j \in \mathcal{C}; Q_i = L_i^{ch}, \forall i \in \mathcal{V}; \mathcal{L} = 0; I_{des}$ = off
Iteration:
1: for $\forall j \in \mathcal{L}$ do
2:   for $\forall i \in \mathcal{V}(j)$ do
3:     Read (new) $\{S^{(j_i)}, i_{min1}^{(j_i)}, L_{min1}^{(j_i)}, L_{min2}^{(j_i)}\}$, where $j_i$ is the preceding layer of VN i.
4:
$$\text{Compute } L_{j_i \to i}^{new} \leftarrow \begin{cases} S^{(j_i)} \cdot S_{i \to j_i} \cdot L_{min1}^{(j_i)}, & \text{if } i \neq i_{min1}^{(j_i)} \\ S^{(j_i)} \cdot S_{i \to j_i} \cdot L_{min2}^{(j_i)}, & \text{if } i = i_{min1}^{(j_i)} \end{cases}$$
5:     Compute $P_i \leftarrow Q_i + L_{j_i \to i}^{new}$ TABLE 4-continued Desaturated Layered Min-Sum Decoding
Algorithm 4 Desaturated Layered Min-Sum Decoding 6:     If $I_{des}$ = on and VN i is the first time visited, then divide $P_i$ by 2.
7:     Read (old) $\{S^{(j)}, i_{min1}^{(j)}, L_{min1}^{(j)}, L_{min2}^{(j)}\}$.
8:
$$\text{Compute } L_{j \to i}^{old} \leftarrow \begin{cases} S^{(j)} \cdot S_{i \to j} \cdot L_{min1}^{(j)}, & \text{if } i \neq i_{min1}^{(j)} \\ S^{(j)} \cdot S_{i \to j} \cdot L_{min2}^{(j)}, & \text{if } i = i_{min1}^{(j)} \end{cases}$$
9:     If $I_{des}$ = on, then divide $L_{j \to i}^{old}$ by 2.
10:     Compute $Q_i \leftarrow P_i - L_{j \to i}^{old}$.
11:     Store $S_{i \to j} \leftarrow \text{sign}(Q_i)$
12:     Update CN j's new information, $\{S^{(j)}, i_{min1}^{(j)}, L_{min1}^{(j)}, L_{min2}^{(j)}\}$, with
    respect to $Q_i$.
13:   end for
14:   Store $\{S^{(j)}, i_{min1}^{(j)}, L_{min1}^{(j)}, L_{min2}^{(j)}\}$
15: end for
16: If the hard-decision of $[P_1, P_2, \ldots, P_n]$ yields the all-zero syndrome, then stop.
17: Update $\theta_C$, the number of saturated $L_{min1}^{(j)}$ of the current iteration,
18: Circularly increase layer number $\mathcal{L}$ by 1.
19: If $\mathcal{L} = 0$ and $\theta_C > \Theta$, then set $I_{des}$ = on, otherwise off; reset $\theta_C = 0$.

The above description provides a novel adaptive desaturation method that is incorporated into the quantization operation in VN update of message-passing decoder of LDPC codes. Specifically, when a large portion of CN-to-VN messages are saturated to maximum fixed-precision values, halving all CN-to-VN messages facilitates the saturation of correct messages and improves error correction over small trapping sets. The proposed adaptive desaturation methods have been proved by simulations conducted by the inventor to reduce error floor by orders of magnitudes, with negligible add-on hardware. Though the proposed desaturation scheme is presented in the form of flooding min-sum decoding and layered min-sum decoding, it may be extended to all variants of message-passing decoding of LDPC codes, e.g., shuffled decoding (whose efficiency lies between flooding decoding and layered decoding).

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope

What is claimed is:
1. A method comprising:
receiving, by an electronic device, input data;
performing, by the electronic device, layered decoding of the input data to generate decoded output data; and
during performing layered decoding, in response to detecting that a proportion of values of CN-to-VN messages that exceed a maximum value meets a threshold condition, by halving all of the CN-to-VN messages, wherein halving all CN-to-VN messages saturates correct messages and increases an error correction capability over small trapping sets.
2. The method of claim 1, wherein performing layered decoding includes min-sum decoding.
3. The method of claim 1, wherein performing layered decoding includes SAP decoding.
4. The method of claim 1, wherein the layered decoding of the input data is performed using a Tanner graph.
5. The method of claim 4, wherein the Tanner graph implements a quasi-cyclic low density parity code matrix.

6. The method of claim 1, wherein the maximum value is a maximum fixed point value representable by CNs.

7. An electronic device including circuits configured to:
receive input data; and
perform layered min-sum decoding of the input data to generate decoded output data, wherein layered min-sum decoding includes, if a number of values of the CN-to-VN messages exceed a maximum value meets a threshold condition, halving all of the VN-to-CN messages generated during a preceding iteration and all a-posterior (APP) messages generated during a current iteration.

8. The electronic device of claim 7, further comprising circuits configured to perform layered min-sum decoding of the input data using a Tanner graph.

9. The electronic device of claim 8, wherein the Tanner graph implements a quasi-cyclic low density parity code matrix.

10. The electronic device of claim 7, further comprising circuits configured to pass messages between nodes quantized in a non-uniform manner.

11. The electronic device of claim 10, further comprising non-uniformly quantizing the CN-to-VN messages exceeding the maximum value.

12. The electronic device of claim 7, wherein the electronic device comprises a dedicated hardware device including specialized circuits implementing the layered min-sum decoding of the input data.

13. The electronic device of claim 12, further comprising during performing layered min-sum decoding, if a number of values of the CN-to-VN messages exceed a maximum value meets a threshold condition, halving all a-posterior probability (APP) messages.

14. The electronic device of claim 13, further comprising halving all the APP messages at a first time of the current iteration.

15. The electronic device of claim 12, further comprising halving all VN-to-CN messages generated during a preceding iteration.

16. The electronic device of claim 12, further comprising one or more storage registers, wherein the maximum value is a maximum fixed-point value representable by the one or more registers.

17. An electronic device including circuits configured to:
receive input data; and
perform layered min-sum decoding of the input data to generate decoded output data, wherein layered min-sum decoding includes performing a number of iterations to generate the decoded output data and halving all VN-to-CN messages generated during a preceding iteration and all a-posterior probability (APP) messages during a current iteration.

18. The electronic device of claim 17, wherein layered min-sum decoding includes halving all the a-posterior probability (APPS messages at a first time of a current iteration.

19. The electronic device of claim 17, wherein layered min-sum decoding includes halving all VN-to-CN messages generated during a preceding iteration.

\* \* \* \* \*